United States Patent
Hoang et al.

(10) Patent No.: US 8,836,366 B2
(45) Date of Patent: Sep. 16, 2014

(54) METHOD FOR TESTING INTEGRATED CIRCUITS WITH HYSTERESIS

(75) Inventors: Anh T. Hoang, Fremont, CA (US);
Brian S. Park, San Jose, CA (US);
Patrick D. McNamara, San Francisco, CA (US)

(73) Assignee: Apple Inc., Cupertino, CA (US)

(*) Notice: Subject to any disclaimer, the term of this patent is extended or adjusted under 35 U.S.C. 154(b) by 226 days.

(21) Appl. No.: 13/454,830

(22) Filed: Apr. 24, 2012

(65) Prior Publication Data

US 2013/0088254 A1 Apr. 11, 2013

Related U.S. Application Data

(60) Provisional application No. 61/544,777, filed on Oct. 7, 2011.

(51) Int. Cl.
*G01R 31/02* (2006.01)
*G01R 31/28* (2006.01)
*G01R 31/3163* (2006.01)

(52) U.S. Cl.
CPC ........ *G01R 31/2834* (2013.01); *G01R 31/2841* (2013.01); *G01R 31/3163* (2013.01); *G01R 31/2837* (2013.01); *G01R 31/2884* (2013.01)
USPC ............... 324/762.01; 324/750.3; 327/205

(58) Field of Classification Search
CPC .. G01R 31/26; G01R 31/275; G01R 31/2834; G01R 31/2837; G01R 31/2841; G01R 31/2884; G01R 31/3163
USPC ............... 324/750.01–750.3, 762.01–762.09
See application file for complete search history.

(56) References Cited

U.S. PATENT DOCUMENTS

| | | | |
|---|---|---|---|
| 5,850,157 A | 12/1998 | Zhu et al. | |
| 5,936,448 A * | 8/1999 | Ohie et al. | 327/205 |
| 6,066,965 A | 5/2000 | Blomgren | |
| 6,590,423 B1 | 7/2003 | Wong | |
| 7,268,633 B2 | 9/2007 | von Kaenel | |

(Continued)

OTHER PUBLICATIONS

Stroud; "Anatomy of a Flip-Flop ELEC 4200 Set-Reset (SR) Latch;" Auburn University, Aug. 2006.

(Continued)

*Primary Examiner* — Arleen M Vazquez
*Assistant Examiner* — Son Le
(74) *Attorney, Agent, or Firm* — Rory D. Rankin; Meyertons, Hood, Kivlin, Kowert & Goetzel, P.C.

(57) ABSTRACT

A system and method for testing circuits. A generated input voltage waveform for a first phase of a test may use transitions with a voltage swing between expected low and high trigger points for an integrated circuit (IC) with hysteresis. A generated input voltage waveform for a second phase of the test may use transitions with a voltage swing between the expected low trigger point and a high sub-threshold value. The high sub-threshold value may be a tolerable voltage difference below the expected high trigger point. A generated input voltage waveform for a third phase of the test may use transitions with a voltage swing between the expected high trigger point and a low sub-threshold value. The low sub-threshold value may be a tolerable voltage difference above the expected low trigger point. The expected trigger points and sub-threshold values may be found from earlier characterization studies for the IC.

25 Claims, 6 Drawing Sheets

(56) References Cited

U.S. PATENT DOCUMENTS

| | | |
|---|---|---|
| 7,395,286 B1 | 7/2008 | Koh et al. |
| 7,598,774 B2 | 10/2009 | Belluomini et al. |
| 7,782,126 B2 | 8/2010 | Cagno et al. |
| 2010/0052743 A1 | 3/2010 | Kamizuma et al. |
| 2010/0117703 A1 | 5/2010 | Zhu et al. |
| 2011/0140753 A1 | 6/2011 | Papaefthymiou et al. |
| 2012/0049875 A1* | 3/2012 | Belser et al. ............... 324/750.3 |

OTHER PUBLICATIONS

U.S. Appl. No. 13/274,662, entitled "Reduced Voltage Swing Clock Distribution", by Michael E. Runas and James S. Blomgren, filed Oct. 17, 2011. 36 pages.

* cited by examiner

METHOD FOR TESTING INTEGRATED CIRCUITS WITH HYSTERESIS

CROSS REFERENCE TO RELATED APPLICATIONS

This application claims the benefit of U.S. Provisional Application No. 61/544,777 filed on Oct. 7, 2011, which is incorporated by reference herein in its entirety.

BACKGROUND OF THE INVENTION

1. Field of the Invention

This invention relates to electronic circuits, and more particularly, to efficiently testing circuits with hysteresis.

2. Description of the Relevant Art

The output of a system with hysteresis depends both on a current input value and a current output value, which is based on a past input value. This system has more than one stable output state. The system may snap, or quickly transition, from one stable state to another stable state in response to an input trigger pulse and its history. A circuit with hysteresis may have at least two stable states. The circuit with hysteresis may have at least two trigger points, such as a high trigger point and a low trigger point.

In response to an input signal being above a high trigger point after the input had previously been below the low trigger point, the output of the circuit with hysteresis changes from its current stable value to another stable value. In response to the input signal being below a low trigger point after the input had previously been above the high trigger point, the output changes from its current value to another stable value. The current stable value and the other stable value may depend on whether the circuit with hysteresis is inverting or non-inverting. In response to the input signal is between the high trigger point and the low trigger point, the output retains its current stable value. Such a circuit with hysteresis may be referred to as a bistable multivibrator. A Schmitt trigger is one example of a circuit with hysteresis. A circuit with hysteresis may be used for noise immunity and for waveform generators, such as an oscillator.

Automatic test equipment (ATE) is used to provide given input values to fabricated chips. A high-speed, complex ATE may be relatively expensive. A low-speed ATE consumes longer test times. Circuitry for built-in self-test (BIST) allows a design to test itself, but consumes on-die real estate for the test circuit and control logic. Tests for fabricated chip designs that include circuits with hysteresis verify whether the high and low thresholds are at acceptable values. Typically, two steps or tests are used. For a first test, an input voltage is swept from a logic high value to a given low threshold value at given increment steps, such as a fraction of a volt. The output values are recorded and checked. For a second test, the input voltage is swept from a logic low value to a given high threshold value at the given increment steps. The output values are again recorded and checked.

The above-described testing method for circuits with hysteresis consumes a lot of time. The cost of testing may not be great for characterization studies. However, for a large number of device packages for production, such as millions of packages, the cost is high. If the tests are executed only on a small number of packages at production time, then high-coverage testing is not achieved.

In view of the above, efficient methods and mechanisms for efficiently testing circuits with hysteresis are desired.

SUMMARY OF EMBODIMENTS

Systems and methods for efficiently testing circuits with hysteresis are contemplated. In one embodiment, a test system includes a semiconductor part under test and test equipment. The part under test includes an integrated circuit (IC) with hysteresis. The test equipment may generate a test waveform and send the test waveform via a channel to an input of the IC. The output of the IC may be digitized and stored for a later comparison to expected digital values. The test may utilize values from characterization studies of the IC. For example, expected low and high trigger points for the IC with hysteresis may be found at a given semiconductor process corner.

In addition to the expected trigger point values, sub-threshold voltage levels may be found during the characterization studies. The sub-threshold values may be within a given tolerated voltage difference from a respective trigger point at the given process corner. A generated input voltage waveform for a first phase of the test may use transitions with a voltage swing between the expected low and high trigger points. A generated input voltage waveform for a second phase of the test may use transitions with a voltage swing between the expected low trigger point and the high sub-threshold value. The high sub-threshold value may be a tolerable voltage difference below the expected high trigger point. A generated input voltage waveform for a third phase of the test may use transitions with a voltage swing between the expected high trigger point and the low sub-threshold value. The low sub-threshold value may be a tolerable voltage difference above the expected low trigger point.

These and other embodiments will be further appreciated upon reference to the following description and drawings.

Figure 1:
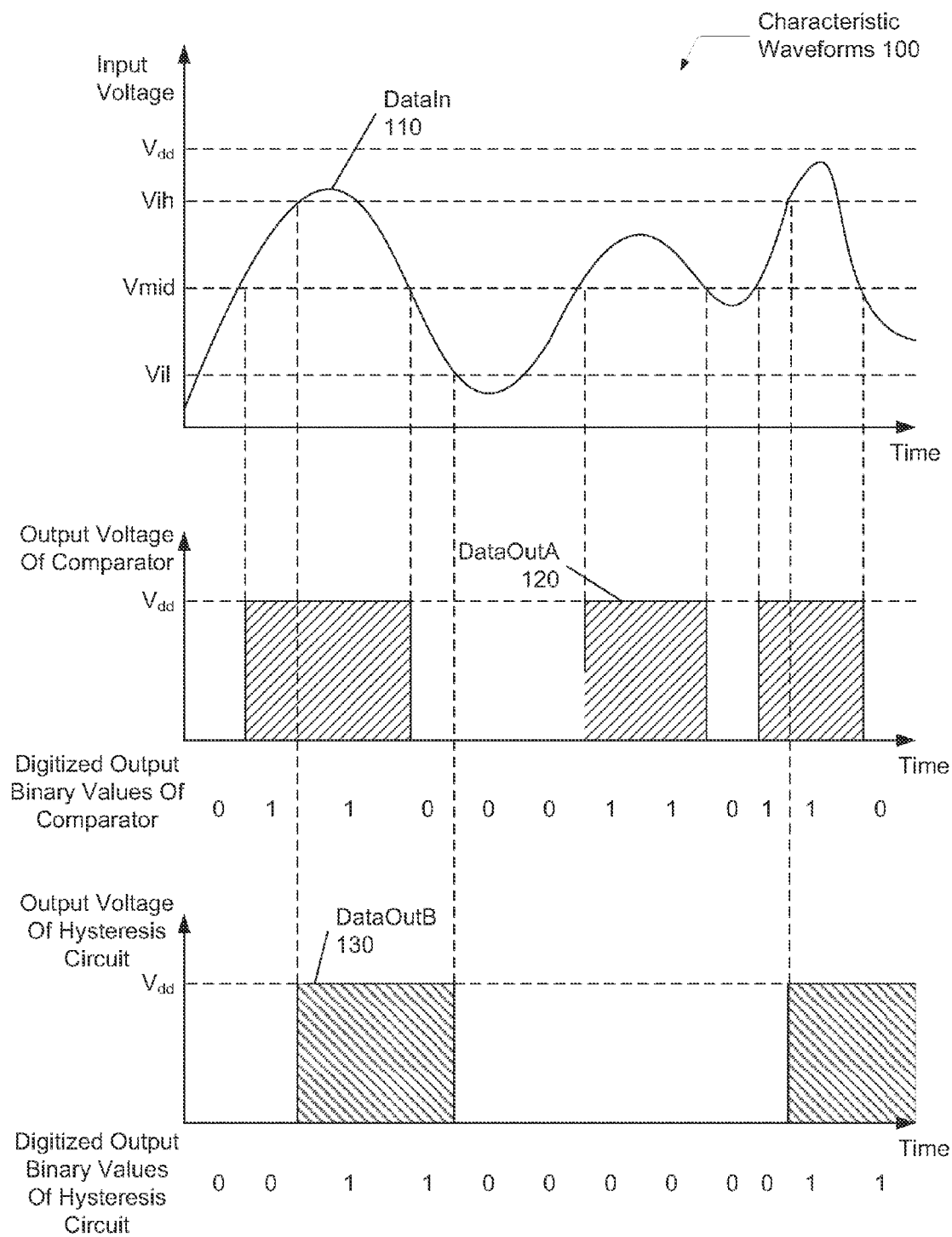
FIG. 1 is a generalized block diagram illustrating one embodiment of input and output voltage waveforms for a noisy input and noise immune circuits.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Referring to FIG. 1, a generalized block diagram illustrating one embodiment of input and output voltage waveforms 100 for a noisy input and noise immune circuits is shown. In the illustrated embodiment, an input voltage signal, DataIn 110, may represent a resulting signal from a combination of an information-bearing signal and one or more unrelated signals. The unrelated signals may originate from a noisy environment and combine or superimpose onto the information-bearing signal.

The noise portion of the DataIn signal 110 may have a sufficiently large amplitude to cause a circuit receiving the DataIn signal 110 to have a metastable state on its output. The metastable state may resolve to an incorrect value. For example, the output may resolve to a digital logical low value, such as a ground reference, instead of an expected digital logical high value, such as the power supply voltage, and vice-versa. Additionally, even if the metastable state resolves to a correct value, both delay and extra power consumption is introduced into a corresponding datapath.

The unrelated or noise portion of the DataIn signal 110 may also include relatively frequent switching signals. In one example, when the frequent switching occurs at a voltage level near a threshold voltage of a receiving transistor, the output of the circuit may also switch frequently. This frequent switching on the output may cause incorrect values on the output or a metastable state that may lead to incorrect values and at least delays and extra power consumption in the datapath.

A particular receiving circuit may be used to remove the noise portion from the DataIn signal 110 and provide the information-bearing signal. The information-bearing signal may then be sent to other circuits for processing and/or storage. In one example, a comparator circuit with a single, fixed threshold may receive the DataIn signal 110. The comparator may have an intermediate voltage level between the power supply voltage, $V_{dd}$, and the ground reference. In one example, the comparator may have a threshold value at a midpoint voltage, $V_{mid}$, which is half of the power supply voltage, $V_{dd}$. A generated output voltage waveform of such a comparator is shown as the DataOutA signal 120.

As shown in FIG. 1, each time the DataIn signal 110 rises from below the $V_{mid}$ value to above the $V_{mid}$ value, the DataOutA signal 120 rises to a logic high value. Similarly, each time the DataIn signal 110 falls from above the $V_{mid}$ value to below the $V_{mid}$ value, the DataOutA signal 120 falls to a logic low value. The output DataOutA signal 120 is shown as a digitized output. An analog version may have slower rise and fall times than the digitized output and may not actually reach either of the full power supply voltage $V_{dd}$ or the ground reference. The DataOutA signal 120 changes between logical values as the DataIn signal 110 transitions near the $V_{mid}$ value. The frequent switches on the DataOutA signal 120 may provide both incorrect values and extra power consumption. Therefore, a comparator may not be used for noise immunity on the DataIn signal 110.

In one example, a circuit with hysteresis may receive the DataIn signal 110. The output of a circuit with hysteresis retains a current value until a voltage swing of the input reaches a sufficient value to trigger a change in the output. A circuit with hysteresis may have two threshold values. These two threshold values may also be referred to as two trigger points.

With a non-inverting configuration, a circuit with hysteresis may have a logic high value on its output when the input is above a high trigger point after a voltage swing that began below the low trigger point. Similarly, a non-inverting circuit with hysteresis may have a logic low value on its output when the input is below the low trigger point after a voltage swing that began above the high trigger point. When the input is between the high trigger point and the low trigger point, the output retains its current value. With an inverting configuration, a circuit with hysteresis may provide a logic low value on its output when the input is above the high trigger point and provide a logic high value on its output when the input is below a low trigger point. However, the inverting circuit with hysteresis still retains a current value on its output when the input is between the high trigger point and the low trigger point.

A Schmitt trigger is one example of a circuit with hysteresis. When a circuit with hysteresis, such as a Schmitt trigger or other device, is used with an open loop, positive feedback configuration, the circuit may be used for noise immunity. A circuit in this configuration typically introduces positive feedback by adding a part of the output voltage to the input voltage so that the loop gain is greater than unity. When a circuit with hysteresis is used with a closed loop, negative feedback configuration, the circuit may be used as a bistable multivibrator, such as an oscillator. An open loop, positive feedback version of a circuit with hysteresis used for noise immunity is further described below.

As shown in FIG. 1, each time the DataIn signal 110 rises from below a low trigger point $V_{il}$ value to above a high trigger point $V_{ih}$ value, the DataOutB signal 130 rises to a logic high value. This example illustrates a non-inverting circuit with hysteresis. An inverting configuration is possible and contemplated. Similarly, each time the DataIn signal 110 falls from above the high trigger point $V_{ih}$ value to below the low trigger point $V_{il}$ value, the DataOutB signal 130 falls to a logic low value. The output DataOutB signal 130 is shown as a digitized output. An analog version may have slower rise and fall times than the digitized output and may not actually reach either of the full power supply voltage $V_{dd}$ or the ground reference.

The DataOutB signal 130 changes between logical values as the DataIn signal 110 transitions with voltage swings greater than the difference between the high trigger point $V_{ih}$ value and the low trigger point $V_{il}$ value. The frequent, smaller switches on the DataIn signal 110 may be ignored. Accordingly, the circuit with hysteresis may remove the noise from the DataIn signal 110.

Figure 2:
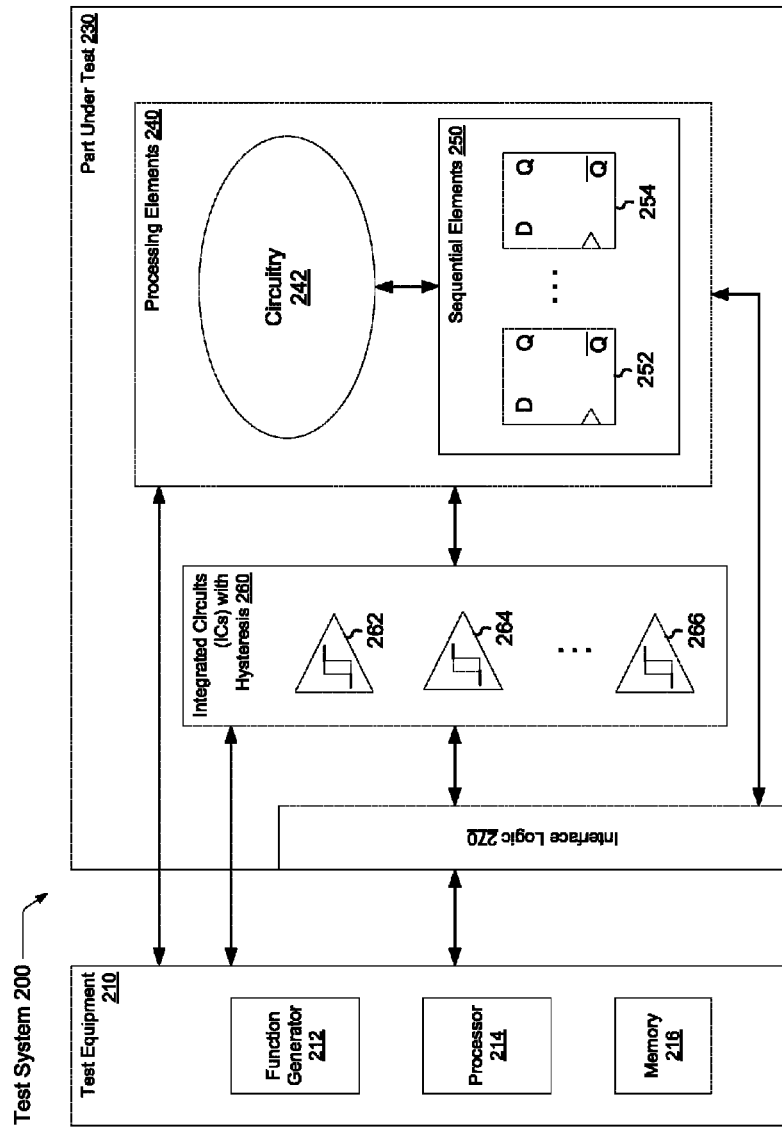
FIG. 2 is a generalized block diagram illustrating one embodiment of a test system.

Turning now to FIG. 2, a generalized block diagram illustrating one embodiment of a test system 200 is shown. As shown, the test system 200 may include test equipment 210 connected to a part under test 230. The test equipment may include a host computer or another tester with a processor 214. The processor 214 may load and execute instructions of a software program, such as test code, stored on memory 216. When the processor 214 executes the instructions of the test code, the processor 214 may control a function generator 212 to generate one or more voltage waveforms on channels connected to the part under test 230. Although a description of test equipment follows, characterization and test cycles for the part under test 230 may be performed by another chip on-die, another chip on a same printed circuit board or card, and other types of equipment. For example, a first processing unit may include test circuitry used to perform test patterns and cycles on a second processing unit. In one embodiment, each of the first processing unit and the second processing unit may be on a same die, such as a system-on-a-chip (SOC). In another embodiment, the first processing unit may be in a separate package than a package that includes the second processing unit.

The test equipment 210 may be used to verify correct operation of the part under test 230. The test equipment 210 may include multiple instruments used to generate and measure signals. The test equipment 210 may receive signals from the part under test 230 and perform comparisons and measurements with the received data. The test code stored on the memory 216 and executed by the processor 214 may direct the test equipment 210 on the measurement, comparisons and analysis of the received data.

One or more channels and connection points between the test equipment 210 and the part under test 230 may perform different functions than functions on other channels and connection points. The test equipment 210 may include other components not shown to control an operating environment for the part under test 210. For example, variances in ambient temperature, power supply voltage, operating clock frequency, slew rate, other electrical characteristics, and so forth, may be used to fully verify the part under test 230.

The part under test 230 may be a semiconductor device, such as an integrated circuit. Examples of such an integrated circuit may include a microprocessor, an application specific integrated circuit (ASIC), a system-on-a-chip (SOC), a graphics processing unit (GPU), a programmable gate array (PGA), and so forth. The integrated circuit may be a die on a semiconductor wafer, a standalone packaged part, a packaged part within a printed circuit board (pcb), and so forth. The integrated circuit may use any available transistor technology. Examples may include at least complementary metal oxide semiconductor (CMOS) technology, transistor-to-transistor logic (TTL) technology, and bipolar junction transistor (BJT) technology.

The part under test 230 may include an interface logic 270, one or more integrated circuits (ICs) with hysteresis 260, and processing elements 240, which may include circuitry 242 and sequential elements 250. The interface logic 270 may include input/output (I/O) over-voltage protection devices and I/O protocol logic. The integrated circuits (ICs) with hysteresis 260 may include one or more ICs with hysteresis, such as ICs 262, 264 and 266. The ICs with hysteresis may include I/O circuitry for noise immunity. In addition the ICs with hysteresis may include bistable multivibrators used as oscillators and waveform generators. Although the ICs with hysteresis are shown grouped in one location, one or more ICs may be included in the interface logic 270 and in the circuitry 242.

The processing elements 240 may include circuitry 242 and sequential elements 250. The circuitry 242 may be used to perform arithmetic operations, data comparisons, data conversions, and the like. The sequential elements 250 may include one or more data storage elements 252 and 254 that utilize a clock to synchronize data storage and updates. The storage elements 252 and 254 may generally include registers, flip-flops, latches, content addressable memory (CAM), random access memory (RAM), caches, and so forth.

The test equipment 210 may generate signals on channels to different voltage levels for given time periods as determined by test code. The generated signals with varying voltage levels over time are sent over the channels to the part under test 230. Later, the test equipment 210 may receive values from the part under test 230 and compare the received values to expected values. This cycle may be repeated one or more times. The channels between the test equipment 210 and the part under test 230 may have connection points both in the interface logic 270 and in other areas of the part under test 230, such as within the ICs with hysteresis and within the processing elements 240.

The test equipment 210 may be used to characterize circuitry within the part under test 230. These characterization studies of the part under test 230 may be used to generate test waveforms and expected values for subsequent verification tests on other parts under test. For example, the characterization studies may determine the high and the low trigger points for one or more ICs with hysteresis. In addition, the characterization studies may determine a tolerance for a given IC to have different characteristics than characteristics found in the studies.

In one example, a given IC with hysteresis may have a high trigger point that is 70% of the power supply voltage and a low trigger point that is 30% of the power supply voltage. An acceptable tolerance may be determined to be +/−3% of the power supply voltage. Therefore, during a later verification test of another part with a same IC with hysteresis, when the IC with hysteresis toggles its output with a high trigger point that is 67% of the power supply voltage, the verification test may provide a pass status or result, rather than a fail status or result.

The characterization studies may consume an appreciable amount of time. During a testing stage of a chip design cycle, this amount of time may be tolerable. However, during other stages, this amount of time may not be tolerable. One example is a production stage. Packaged parts may be quickly tested for verification, speed binning, and other purposes. With possibly hundreds of thousands of parts to test in a short amount of time, efficient test methods are used. However, testing and verifying the high and the low trigger points of ICs with hysteresis using the stepping voltage waveforms from the characterization studies consumes a large amount of time. The characterization study waveforms and a more efficient test are further described below.

Figure 3:
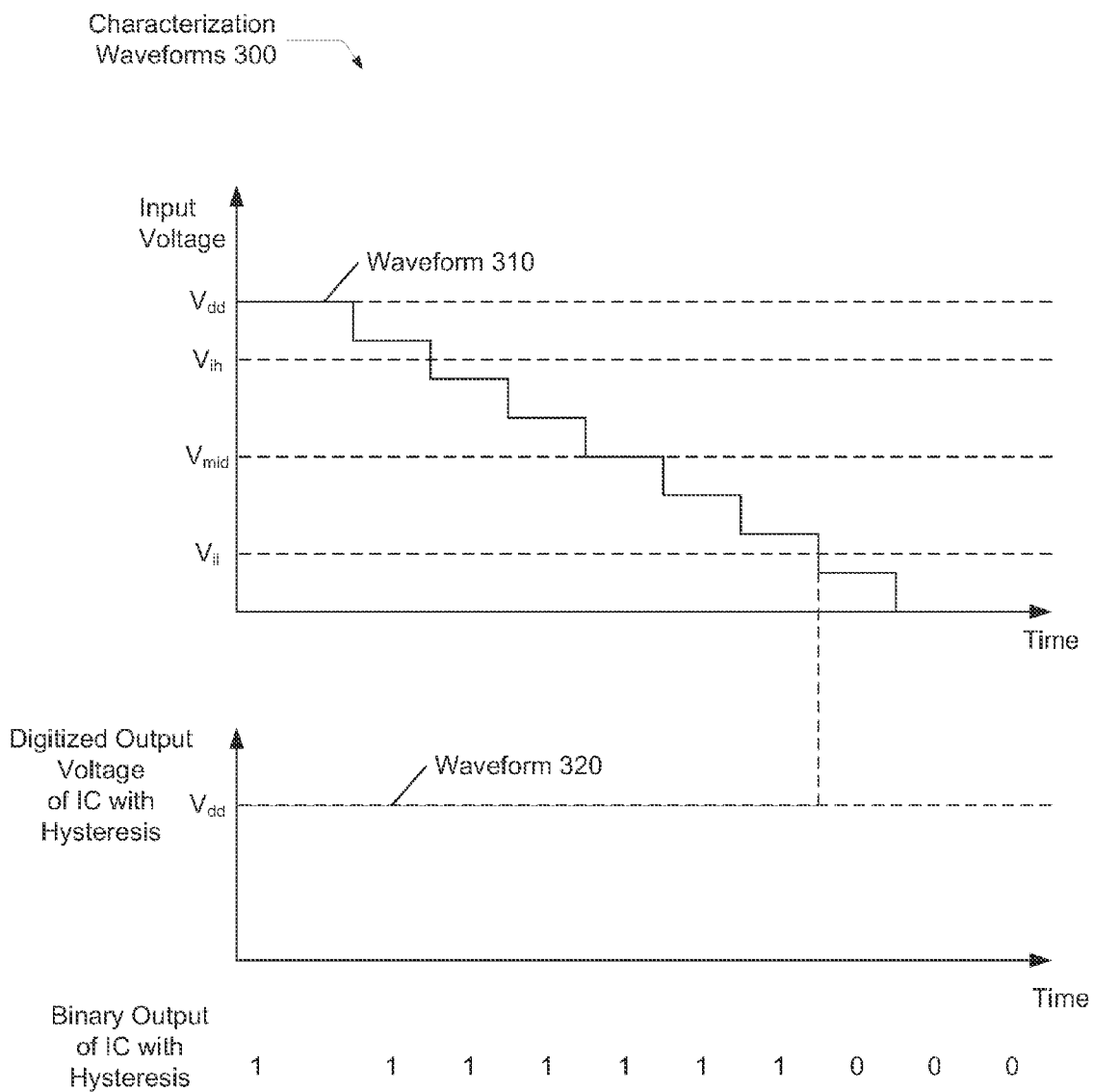
FIG. 3 is a generalized block diagram illustrating one embodiment of characterization waveforms for an IC with hysteresis.

Turning now to FIG. 3, a generalized block diagram illustrating one embodiment of characterization waveforms 300 for an IC with hysteresis is shown. Typically, a characterization study for an IC with hysteresis, such as a Schmitt trigger, utilizes two steps. In one example, a first step includes sweeping an input voltage in gradual steps from a power supply voltage until the low trigger point $V_{il}$ value is found. The gradually decreasing input voltage may eventually reach the ground reference. Digitized outputs of the IC with hysteresis may be recorded during the stepping process. The waveform 310 may be used as an input test or characterization waveform to an input of an IC with hysteresis. Referring again to FIG. 2, test code within the test equipment 210 may cause the voltage levels in the waveform 310 to be driven onto a given channel between the test equipment 210 and the part under test 230.

This given channel may have a connection point within the part under test 230 that is an input to a given IC with hysteresis.

The waveform 310 may begin at the power supply voltage, $V_{dd}$, and is decremented by a given voltage step during each given time interval. For example, a voltage step of 0.05 volt and a time interval of 0.5 microseconds may be used. The selected values may be based on tolerances for the trigger points and a total expected study time. In addition, the selected values may be based on a given semiconductor process corner for the IC with hysteresis, since the tolerance of the trigger points may be based on this same criteria. In other examples, the input waveform 310 may begin at another voltage level, such as half of the power supply voltage. Selection of the initial voltage level may be based on an estimate of an expected value of the low trigger point $V_{il}$ value, a given number of steps, and so forth.

The output waveform 320 may be read from the output of the IC with hysteresis. The waveform 320 may be a digitized value and therefore does not show analog effects. A binary output of the waveform 320 is also shown. At least these binary values and time markings and input voltage level values may be stored for later comparisons. After the stepping is completed, the binary values may be checked to find when the output waveform 320 changed from a logic high value to a logic low value. The corresponding value of the input waveform 310 may provide the low trigger point $V_{il}$ value for the IC with hysteresis.

Figure 4:
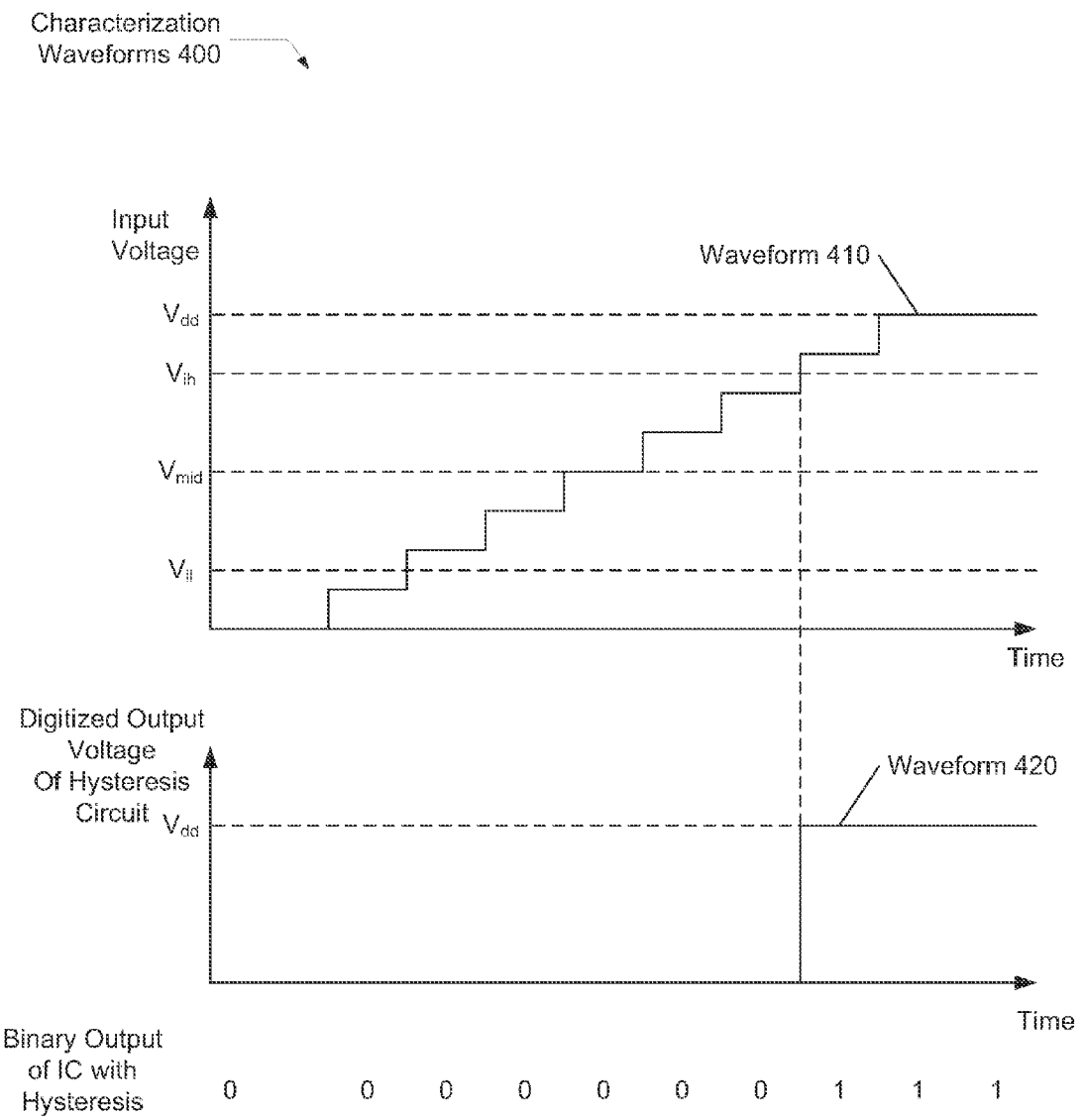
FIG. 4 is a generalized block diagram illustrating another embodiment of characterization waveforms for an IC with hysteresis.

Referring now to FIG. 4, a generalized block diagram illustrating another embodiment of characterization waveforms 400 for an IC with hysteresis is shown. As described earlier, a characterization study for an IC with hysteresis typically utilizes two steps. A first step may be performed as described above regarding the waveforms 310 and 320. In one example, a second step includes sweeping an input voltage in gradual steps from a ground reference until the high trigger point $V_{ih}$ value is found. The gradually increasing input voltage may eventually reach the power supply voltage. Digitized outputs of the IC with hysteresis may be recorded during the stepping process. The waveform 410 may be used as an input test or characterization waveform to an input of an IC with hysteresis. Referring again to FIG. 2, test code within the test equipment 210 may cause the voltage levels in the waveform 410 to be driven onto a given channel between the test equipment 210 and the part under test 230. This given channel may have a connection point within the part under test 230 that is an input to a given IC with hysteresis.

The waveform 410 may begin at the ground reference and is incremented by a given voltage step during each given time interval. As described earlier, the selected values may be based on tolerances for the trigger points and a total expected study time. In addition, the selected values may be based on a given semiconductor process corner for the IC with hysteresis, since the tolerance of the trigger points may be based on this same criteria. In other examples, the input waveform 410 may begin at another voltage level, such as half of the power supply voltage. Selection of the initial voltage level may be based on an estimate of an expected value of the high trigger point $V_{ih}$ value, a given number of steps, and so forth.

The output waveform 420 may be read from the output of the IC with hysteresis. The waveform 420 may be a digitized value and therefore does not show analog effects. A binary output of the waveform 420 is also shown. At least these binary values and time markings and input voltage level values may be stored for later comparisons. After the stepping is completed, the binary values may be checked to find when the output waveform 420 changed from a logic low value to a logic high value. The corresponding value of the input waveform 410 may provide the high trigger point $V_{ih}$ value for the IC with hysteresis.

Figure 5:
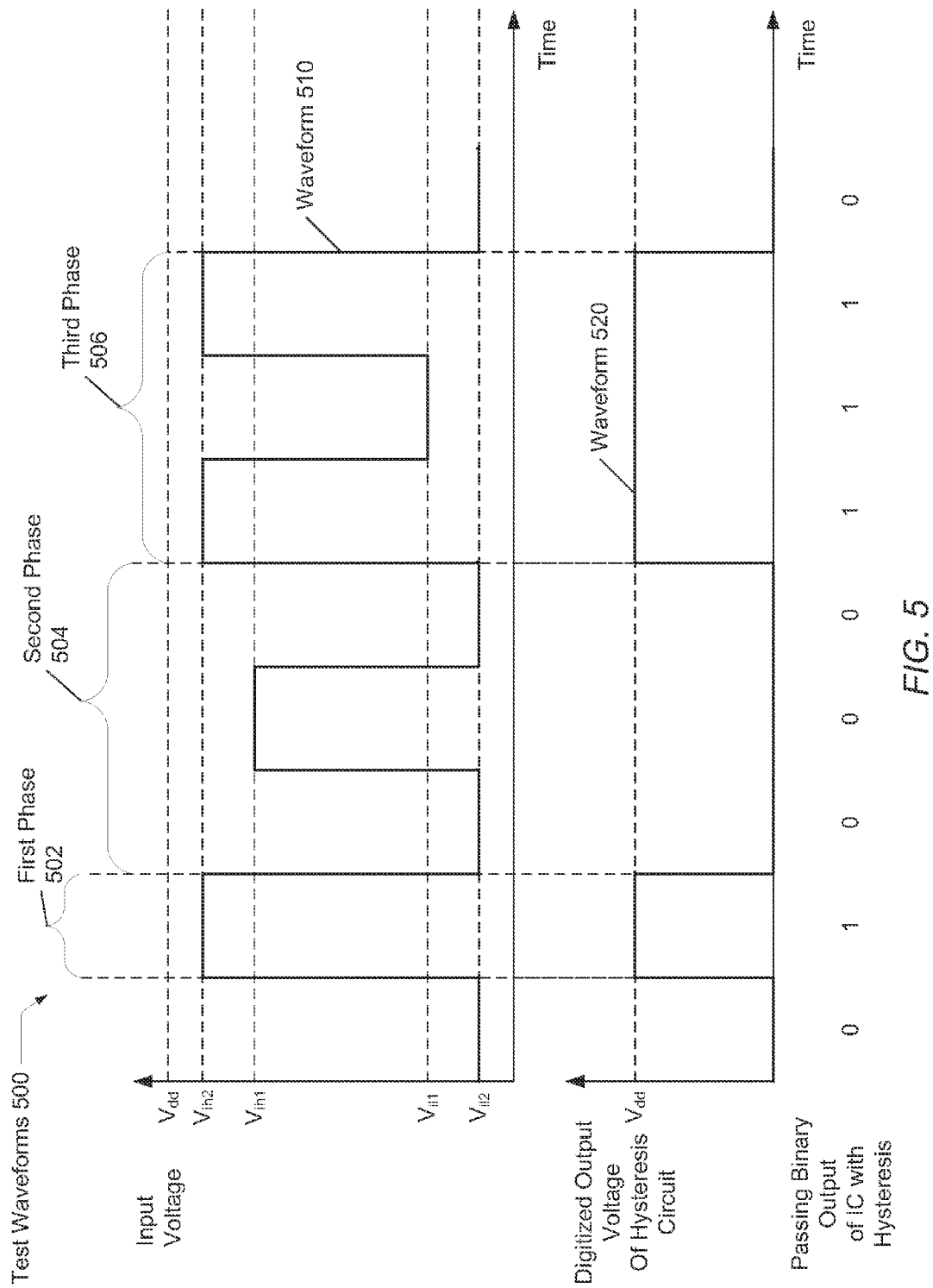
FIG. 5 is a generalized block diagram illustrating one embodiment of test waveforms for an IC with hysteresis.

Referring now to FIG. 5, a generalized block diagram illustrating one embodiment of test waveforms 500 for an IC with hysteresis is shown. Similar to waveforms 310 and 410 described earlier, in one embodiment, test code within the test equipment 210 may cause the voltage levels in the waveform 510 to be driven onto a given channel between the test equipment 210 and the part under test 230. This given channel may have a connection point within the part under test 230 that is an input to a given IC with hysteresis. In other embodiments, the test waveform 510 may be driven by other types of equipment, another chip on-die, another chip on a same printed circuit board or card, and so forth. Different sources of the waveform 510 may be used. However, the efficiency of testing an IC with hysteresis is maintained by the waveform 510 itself and the subsequent quick comparisons for a pass/fail result.

In one embodiment, the test waveform 510 is used after characterization studies are completed. The test waveform 510 may be used during a production phase of a design cycle when hundreds of thousands or even millions of parts are quickly tested. The testing may verify whether the part provides expected behavior and characteristics. For example, an IC with hysteresis may be tested to verify IC meets the low and the high trigger points found during characterization for a given process corner.

As shown, the expected low and high trigger points are labeled as $V_{il2}$ and $V_{ih2}$, respectively. The values $V_{il1}$ and $V_{ih1}$ may be respective tolerance values. For example, for a given CMOS process corner, the expected high trigger point value $V_{ih2}$ may be 70% of the power supply voltage $V_{dd}$. For this given CMOS process corner and a given IC with hysteresis on a given part of millions of parts, the actual high trigger point value may be less than the expected high trigger point value $V_{ih2}$. For this given CMOS process corner, an acceptable deviation from the high trigger point value $V_{ih2}$ may be less than 2% of the power supply voltage $V_{dd}$. Therefore, the value $V_{ih1}$ may be 68% of the power supply voltage $V_{dd}$. The actual high trigger point value may lie between the $V_{ih1}$ and the $V_{ih2}$ values.

In a similar manner as described above for the high trigger point value, for the same given CMOS process corner, the expected low trigger point value $V_{il2}$ may be 30% of the power supply voltage $V_{dd}$. For this given CMOS process corner and a given IC with hysteresis on a given part of millions of parts, the actual low trigger point value may be greater than the expected low trigger point value $V_{il2}$. For this given CMOS process corner, an acceptable deviation from the low trigger point value $V_{ih2}$ may be a same 2% of the power supply voltage $V_{dd}$ as it is for the high trigger point value. Therefore, the value $V_{il1}$ may be 32% of the power supply voltage $V_{dd}$. The actual low trigger point value may lie between the $V_{il1}$ and the $V_{il2}$ values.

In the embodiment shown, the input waveform 510 may be used to generate an efficient test with three phases. During a first phase 502, each of the expected trigger point values, $V_{ih2}$ and the $V_{il2}$, may be verified. The input waveform 510 utilizes a voltage swing between these values. When the input waveform 510 transitions with a rising voltage swing from $V_{il2}$ to $V_{ih2}$, the output waveform 520 transitions from a logic low value to a logic high value. The actual high trigger point may be located between the expected high trigger point value $V_{ih2}$ and the high sub-threshold value $V_{ih1}$. If the actual high trigger point lies between the expected high trigger point value $V_{ih2}$ and the power supply voltage $V_{dd}$, then the IC may be determined to fail. A lack of a transition on the output waveform 520 may indicate a failed part. In a similar manner, the binary output would not change as expected. A trigger point value below the high sub-threshold value $V_{ih1}$ may cause frequent switching. Therefore, the input waveform 510 tests for both cases. For a passing IC with hysteresis, the actual high trigger point value is reached and surpassed by the rising transition in the input waveform 510 during the first phase 502.

The value $V_{ih1}$ may be referred to as a high sub-threshold value. The value $V_{ih1}$ may not be referred to as a second trigger point or a trigger point with tolerance, since the IC with hysteresis is not expected to transition when this value is reached after a voltage swing that begins below the actual low trigger point for the IC. The value $V_{ih1}$ is not expected to "trigger" the IC with hysteresis.

When the input waveform 510 transitions with a falling voltage swing from $V_{ih2}$ to $V_{il2}$, the output waveform 520 transitions from a logic high value to a logic low value. The actual low trigger point may lie between the expected low trigger point value $V_{il2}$ and the low sub-threshold value $V_{il1}$. If the actual low trigger point lies between the expected low trigger point value $V_{il2}$ and the ground reference, then the IC may be determined to fail. A lack of a transition on the output waveform 520 may indicate a failed part. In a similar manner, the binary output would not change as expected. A trigger point value above the low sub-threshold value $V_{il1}$ may cause frequent switching. Therefore, the input waveform 510 tests for both cases. For a passing IC with hysteresis, the actual low trigger point value is reached and surpassed by the falling transition in the input waveform 510 during the first phase 502.

The value $V_{il1}$ may be referred to as a low sub-threshold value. The value $V_{il1}$ may not be referred to as a second trigger point or a trigger point with tolerance, since the IC with hysteresis is not expected to transition when this value is reached after a voltage swing that begins above the actual high trigger point for the IC. The value $V_{il1}$ is not expected to "trigger" the IC with hysteresis.

In a second phase 504, the high sub-threshold value $V_{ih1}$ is verified. During the second phase 504, the input waveform 510 transitions between the $V_{il2}$ and the $V_{ih1}$ values to verify the sub-threshold $V_{ih1}$ value. When the input waveform 510 transitions with a rising voltage swing from $V_{il2}$ to $V_{ih1}$, the output waveform 520 retains its current value, which is a logic low value. Again, the actual high trigger point may lie between the expected high trigger point value $V_{ih2}$ and the high sub-threshold value $V_{ih1}$. The actual high trigger point value is not reached and it is not surpassed by the rising transition in the input waveform 510 during the second phase 504.

When the input waveform 510 transitions with a falling voltage swing from $V_{ih1}$ to $V_{il2}$, again, the output waveform 520 retains its current value, which is a logic low value. Again, the actual low trigger point may lie between the expected low trigger point value $V_{il2}$ and the low sub-threshold value $V_{il1}$. The actual low trigger point value is reached and it is surpassed by the falling transition in the input waveform 510 during the second phase 504. However, the actual low trigger point is not reached by a voltage swing that began at or from above the actual high trigger point. Therefore, the output waveform 520 does not change and the corresponding binary value retains its current value.

Between the second phase 504 and the third phase 506, the input waveform 510 transitions with a rising voltage swing from $V_{il2}$ to $V_{ih2}$. Accordingly, the output waveform 520 transitions from a logic low value to a logic high value. In a third phase 506, the low sub-threshold value $V_{il1}$ is verified. During the third phase 506, the input waveform 510 transitions between the $V_{ih2}$ and the $V_{il1}$ values to verify the sub-threshold $V_{il1}$ value. When the input waveform 510 transitions with a falling voltage swing from $V_{ih2}$ to $V_{il1}$, the output waveform 520 retains its current value, which is a logic high value. Again, the actual low trigger point may lie between the expected low trigger point value $V_{il2}$ and the low sub-threshold value $V_{il1}$. The actual low trigger point value is not reached and it is not surpassed by the falling transition in the input waveform 510 during the third phase 506.

When the input waveform 510 transitions with a rising voltage swing from $V_{il1}$ to $V_{ih2}$, again, the output waveform 520 retains its current value, which is a logic high value. Again, the actual high trigger point may lie between the expected high trigger point value $V_{ih2}$ and the high sub-threshold value $V_{ih1}$. The actual high trigger point value is reached and it is surpassed by the rising transition in the input waveform 510 during the third phase 506. However, the actual high trigger point is not reached by a voltage swing that began at or from below the actual low trigger point. Therefore, the output waveform 520 does not change and the corresponding binary value retains its current value.

As can be seen in FIG. 5, an efficient test with the input waveform 510 may be provided to an IC with hysteresis under test and the stored binary values may be quickly compared with expected binary values. When a match is found for each binary value, the IC with hysteresis may be determined to pass the test and be a verified circuit. This efficient test may be used to verify ICs with hysteresis for a large number of parts under test.

Figure 6:
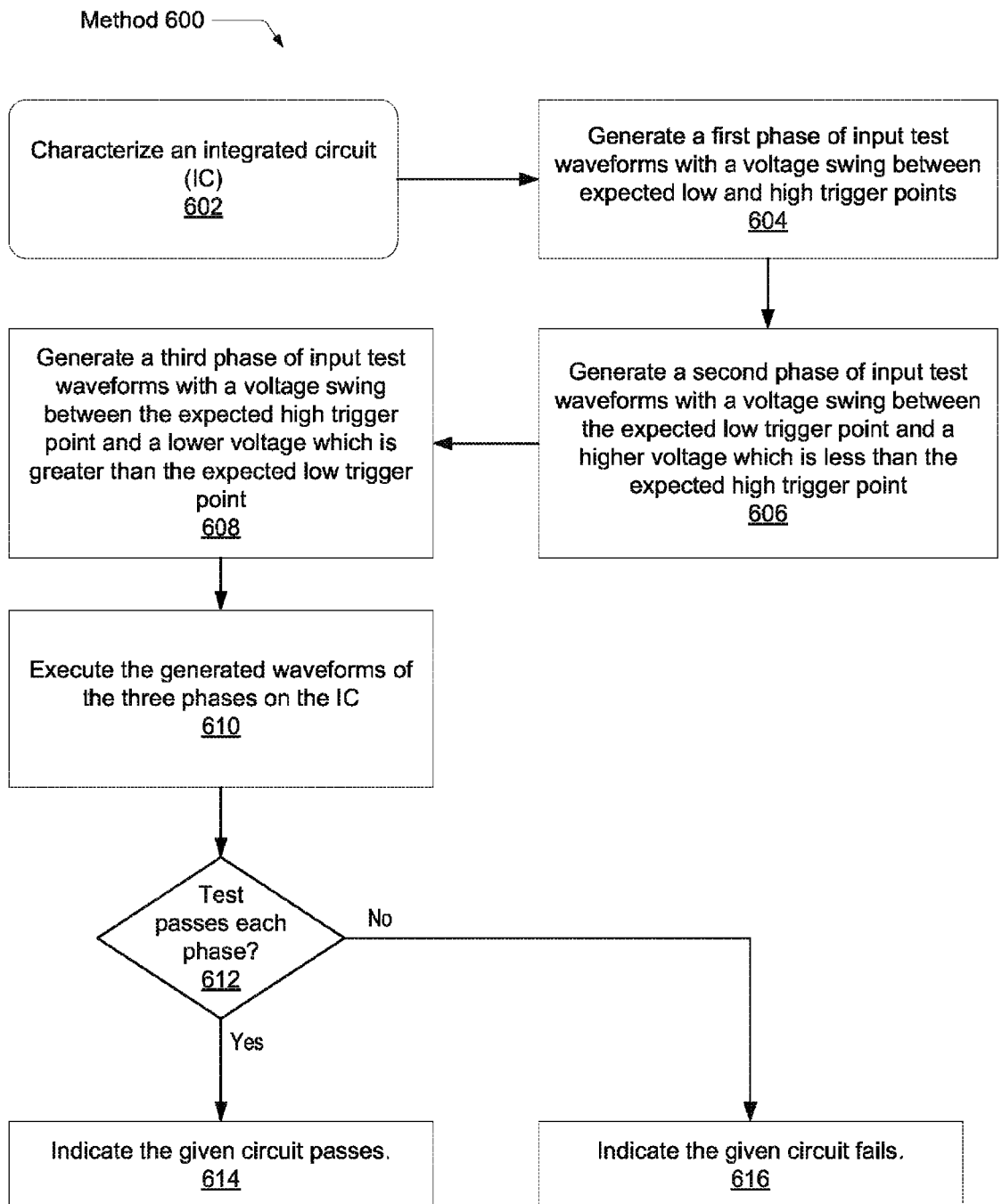
FIG. 6 is a generalized flow diagram illustrating one embodiment of a method for efficiently testing an integrated circuit (IC) with hysteresis.

Turning now to FIG. 6, a generalized flow diagram of one embodiment of a method 600 for efficiently testing an integrated circuit (IC) with hysteresis is shown. Method 600 may be modified by those skilled in the art in order to derive alternative embodiments. Also, the steps in this embodiment are shown in sequential order. However, some steps may occur in a different order than shown, some steps may be performed concurrently, some steps may be combined with other steps, and some steps may be absent in another embodiment.

In the embodiment shown, an integrated circuit (IC) with hysteresis is characterized in block 602. Expected low and high trigger points for the IC may be found at a given semiconductor process corner. In addition, sub-threshold voltage levels that are below the expected high trigger point and above the expected low trigger point may be found. The sub-threshold values may be within a given tolerated voltage difference from a respective trigger point at the given process corner.

In block 604, an input voltage waveform for a first phase of a test may be generated. This test waveform may use transitions with a voltage swing between the expected low and high trigger points. The first phase may determine whether the IC actually operates as expected when these trigger points are used.

In block 606, an input voltage waveform for a second phase of a test may be generated. This test waveform may use transitions with a voltage swing between the expected low trigger point and the high sub-threshold value. Again, the high sub-threshold value may be a voltage value at a tolerable voltage difference below the expected high trigger point found during characterization. The second phase may determine whether the IC actually operates as expected when an input signal varies between the expected low trigger point and the high sub-threshold value.

In block 608, an input voltage waveform for a third phase of a test may be generated. This test waveform may use transitions with a voltage swing between the expected high trigger point and the low sub-threshold value. Again, the low sub-threshold value may be a voltage value at a tolerable voltage difference above the expected low trigger point found during characterization. The third phase may determine whether the IC actually operates as expected when an input signal varies between the expected high trigger point and the low sub-threshold value.

In block 610, the generated waveforms of the three phases may be executed and sent to a given IC with hysteresis. The IC may be located on a semiconductor part under test. The output values of the IC during the test may be digitized and stored for a later comparison step. If the output values generated by the three phases of the test match expected values, then the given IC passes the test. If the output values pass each phase (conditional block 612), then in block 614, an indication of a passed test is generated. A message on a screen of test equipment may provide the indication. Otherwise, if the output values do not pass each phase (conditional block 612), then in block 616, an indication of a failed test is generated.

In various other embodiments, the output values may be collected and compared in real-time, rather than at the end of the execution of the three phases. As soon as a mismatch is found, an indication of a failed test may be generated and the remainder of the test may be abandoned. The input waveforms for the three phases may be executed in a different order than listed and described in the above description. For example, the waveforms for the second and the third phases may be interchanged and the second half of the waveform for the first phase, which is the falling transition, may be tested during the transition between the interchanged third phase and the second phase. Again, the test waveforms for the three phases may be inverted for an inverting configuration of an IC with hysteresis.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor chip comprising:
a first processing unit comprising test circuitry; and
a second processing unit comprising one or more circuits with hysteresis, wherein each of the one or more circuits with hysteresis has an associated high trigger point and an associated low trigger point; and
wherein the test circuitry is configured to:
generate a first voltage waveform comprising a first voltage swing between the low trigger point and a high voltage level which is lower than the high trigger point by a first threshold;
send the first voltage waveform to a given circuit of the one or more circuits with hysteresis; and
store an indication of a failed first test, in response to detecting an output of the given circuit changes logic values during a duration of the first voltage waveform.

2. The semiconductor chip as recited in claim 1, wherein the test circuitry is further configured to store an indication of a passed first test, in response to detecting an output of the given circuit does not change logic values during the duration of the first voltage waveform.

3. The semiconductor chip as recited in claim 2, wherein the first voltage waveform comprises a single rising edge and a single falling edge.

4. The semiconductor chip as recited in claim 2, wherein the test circuitry is further configured to:

generate a second voltage waveform comprising a second voltage swing between the high trigger point and a low voltage level which is higher than the low trigger point by a second threshold;
send the second voltage waveform to the given circuit; and
store an indication of a failed second test, in response to detecting the output of the given circuit changes logic values during a duration of the second voltage waveform.

5. The semiconductor chip as recited in claim 4, wherein the test circuitry is further configured to store an indication of a passed second test, in response to detecting the output of the given circuit does not change logic values during the duration of the second voltage waveform.

6. The semiconductor chip as recited in claim 5, wherein the second voltage waveform comprises a single rising edge and a single falling edge.

7. The semiconductor chip as recited in claim 5, wherein the test circuitry is further configured to:
generate a third voltage waveform comprising a third voltage swing between the high trigger point and the low trigger point, wherein the third voltage waveform comprises a single rising edge and a single falling edge; and
send the third voltage waveform to the given circuit.

8. The semiconductor chip as recited in claim 7, wherein the test circuitry is further configured to store an indication of a passed third test, in response to detecting the output of the given circuit changes logic values once during a duration of the third voltage waveform.

9. The semiconductor chip as recited in claim 8, wherein the test circuitry is further configured to store an indication of a failed third test, in response to detecting the output of the given circuit changes logic values a number of times other than once during the duration of the third voltage waveform.

10. A method comprising:
exhibiting hysteresis by one or more circuits, wherein each of the one or more circuits with hysteresis has an associated high trigger point and an associated low trigger point; and
test circuitry within a processing unit:
generating a first voltage waveform comprising a first voltage swing between a the low trigger point and a high voltage level which is lower than a the high trigger point by a first threshold;
sending the first voltage waveform to a given circuit of the one or more circuits with hysteresis; and
storing an indication of a failed first test, in response to detecting an output of the given circuit changes logic values during a duration of the first voltage waveform.

11. The method as recited in claim 10, further comprising storing an indication of a passed first test, in response to detecting an output of the given circuit does not change logic values during the duration of the first voltage waveform.

12. The method as recited in claim 11, wherein an initial value for the output of the given circuit prior to the first test is a logic low value.

13. The method as recited in claim 12, wherein the first voltage waveform begins with a rising edge.

14. The method as recited in claim 11, further comprising:
generating a second voltage waveform comprising a second voltage swing between the high trigger point and a low voltage level which is higher than the low trigger point by a second threshold;
sending the second voltage waveform to the given circuit; and storing an indication of a failed second test, in response to detecting the output of the given circuit changes logic values during a duration of the second voltage waveform.

15. The method as recited in claim 14, further comprising storing an indication of a passed second test, in response to detecting the output of the given circuit does not change logic values during the duration of the second voltage waveform.

16. The method as recited in claim 15, wherein an initial value for the output of the given circuit prior to the second test is a logic high value.

17. The method as recited in claim 15, wherein the second voltage waveform begins with a falling edge.

18. The method as recited in claim 15, further comprising:
generating a third voltage waveform comprising a third voltage swing between the high trigger point and the low trigger point, wherein the third voltage waveform comprises a single rising edge and a single falling edge; and
sending the third voltage waveform to the given circuit.

19. The method as recited in claim 18, further comprising sending to the given circuit voltage waveforms in the following order: the third voltage waveform followed by the first voltage waveform followed by the second voltage waveform.

20. An automated tester comprising:
an interface to an integrated circuit comprising one or more circuits with hysteresis;
a function generator; and
control logic; and
wherein the function generator is configured to:
generate a first voltage waveform comprising a first voltage swing between a low trigger point of a given circuit of the one or more circuits with hysteresis and a high voltage level which is lower by a first threshold than a high trigger point of the given circuit;
send the first voltage waveform to a given circuit of the one or more circuits with hysteresis; and
wherein the control logic is configured to store an indication of a failed first test, in response to detecting an output of the given circuit changes logic values during a duration of the first voltage waveform.

21. The automated tester as recited in claim 20, wherein the function generator is further configured to:
generate a second voltage waveform comprising a second voltage swing between the high trigger point and a low voltage level which is higher than the low trigger point by a second threshold; and
send the second voltage waveform to the given circuit.

22. The automated tester as recited in claim 21, wherein the control logic is further configured to store an indication of a failed second test, in response to detecting the output of the given circuit changes logic values during a duration of the second voltage waveform.

23. A non-transitory computer-readable storage medium comprising program instructions that are executable to cause a function generator of a tester to:
generate a first voltage waveform comprising a first voltage swing between a low trigger point of a given circuit with hysteresis and a high voltage level which is lower by a first threshold than a high trigger point of the circuit with hysteresis;
send the first voltage waveform to the given circuit; and
cause control logic of the tester to store an indication of a failed first test, in response to detecting an output of the given circuit changes logic values during a duration of the first voltage waveform.

24. The storage medium as recited in claim 23, wherein the program instructions are further executable to store an indication of a passed first test, in response to detecting an output of the given circuit does not change logic values during the duration of the first voltage waveform.

25. The storage medium as recited in claim 24, wherein the program instructions are further executable to:
generate a second voltage waveform comprising a second voltage swing between the high trigger point and a low voltage level which is higher than the low trigger point by a second threshold;
send the second voltage waveform to the given circuit; and
store an indication of a failed second test, in response to detecting the output of the given circuit changes logic values during a duration of the second voltage waveform.

* * * * *

UNITED STATES PATENT AND TRADEMARK OFFICE
CERTIFICATE OF CORRECTION

PATENT NO. : 8,836,366 B2  Page 1 of 1
APPLICATION NO. : 13/454830
DATED : September 16, 2014
INVENTOR(S) : Anh T. Hoang, Brian S. Park and Patrick D. McNamara It is certified that error appears in the above-identified patent and that said Letters Patent is hereby corrected as shown below:

In the Claims:

Column 12, Claim 10, Line 44, please delete "between a the" and substitute -- between the --.

Column 12, Claim 10, Line 45, please delete "than a the" and substitute -- than the --.

Signed and Sealed this
Sixteenth Day of December, 2014

Michelle K. Lee
*Deputy Director of the United States Patent and Trademark Office*